(12) United States Patent
Papadopoulos

(10) Patent No.: US 7,946,287 B2
(45) Date of Patent: May 24, 2011

(54) HYBRID PHOTOVOLTAIC CONCENTRATING SYSTEM WITH CORRECTED TOTAL REFLECTION REFLECTORS FOR VERY LARGE CONCENTRATING RATIOS

(76) Inventor: Alexandros Papadopoulos, Dionyssos (GR)

( * ) Notice: Subject to any disclaimer, the term of this patent is extended or adjusted under 35 U.S.C. 154(b) by 1306 days.

(21) Appl. No.: 10/554,802

(22) PCT Filed: Apr. 2, 2004

(86) PCT No.: PCT/GR2004/000019
§ 371 (c)(1),
(2), (4) Date: Jun. 14, 2006

(87) PCT Pub. No.: WO2004/088759
PCT Pub. Date: Oct. 14, 2004

(65) Prior Publication Data
US 2007/0240705 A1   Oct. 18, 2007

(30) Foreign Application Priority Data
Apr. 2, 2003  (GR) .................................. 030100155

(51) Int. Cl.
*F24J 2/12* (2006.01)
(52) U.S. Cl. ......... 126/688; 126/683; 126/690; 126/691
(58) Field of Classification Search .................. 126/690, 126/688, 683, 597; 359/831, 546, 834; 136/246
See application file for complete search history.

(56) References Cited

U.S. PATENT DOCUMENTS

| | | | |
|---|---|---|---|
| 3,305,686 A * | 2/1967 | Carter et al. | 250/203.4 |
| 4,154,219 A * | 5/1979 | Gupta et al. | 126/575 |
| 4,395,581 A * | 7/1983 | Girard | 359/853 |
| 4,444,468 A * | 4/1984 | Mori | 359/853 |
| 4,720,170 A * | 1/1988 | Learn, Jr. | 359/597 |
| 5,056,892 A * | 10/1991 | Cobb, Jr. | 359/831 |
| 7,109,461 B2 * | 9/2006 | Lasich | 250/203.4 |

* cited by examiner

*Primary Examiner* — Alfred Basichas
(74) *Attorney, Agent, or Firm* — Turocy & Watson, LLP

(57) ABSTRACT

Solar concentrator system(s) that include parabolic Total Reflection Reflectors with corrected Curved Rectangular Total Reflection Prisms are provided. The corrected Curved Rectangular Total Reflection Prisms remove optical imperfections of diffusion typically present at conventional rectangular prisms of conventional parabolic and paraboloid TRR, and enable accurate focusing and high concentration ratios. A variation of the corrected Curved Rectangular Total Reflection Prisms allows the construction of a corrected solar wave guide with total reflection walls (Solar Artery), which enables the removal of the diffusion (and losses) typically present at conventional Hollow Solar Wave Guides, and increase by one or more orders of magnitude the light-propagation range of Solar Arteries for the same level of losses. The solar concentrator system(s) can enable production of both thermal and electric power, and delivery of solar radiation to the interior of a building for replacement of artificial lighting with solar lighting.

13 Claims, 7 Drawing Sheets

US 7,946,287 B2

HYBRID PHOTOVOLTAIC CONCENTRATING SYSTEM WITH CORRECTED TOTAL REFLECTION REFLECTORS FOR VERY LARGE CONCENTRATING RATIOS

BACKGROUND

Construction of Concentrating Photovoltaic (P/V) Systems with conventional parabolic reflectors or with parabolic total reflection reflectors is a well known technology. Yet, current concentrating P/V systems in the market are not cheaper than the conventional, and generally expensive, flat P/V systems. The reason for such market condition is that the construction of parabolic Total Reflection Reflectors (TRRs) from common transparent glass, which would be the cheapest and the most resilient solution, often faces construction difficulties which prevent accomplishing large concentrating ratios.

The main of such difficulties is that the parabolic TRRs from glass have, due to their construction and related technical aspects, rear rectangular prisms with larger height and width than the ones made out of acrylic (compare, for example, the 2-10 mm sizes of those TRRs made of glass with the 0.02-0.2 mm of the acrylic ones). In addition, rectangular prisms present diffusion and poor focusing of the solar rays, which typically gets worse exponentially as their height and their width increase, and thus limits drastically the concentration ratios.

Moreover, such optical imperfection limits the use of secondary reflectors employed for the reduction of the solar image size and the achievement of a Narrow Secondary Beam and high level of concentration ratios, which would be necessary for supplying solar radiation to hollow Solar Wave Guides (Solar Arteries) for the injection of such solar radiation into buildings in order to employ it for solar lighting. The same optical imperfection also limits the construction of hollow Solar Wave Guides (Solar Arteries) with small losses for the transfer of the Solar Radiation inside the buildings for the replacement of artificial lightning with solar lighting.

Until today there have been efforts to transfer solar radiation inside buildings by using large diameter fiber optics. Such approach, even for the most clear fiber optic materials, presents great losses for the solar spectrum (e.g., 50% losses for propagation distance of 20-30 meter).

SUMMARY

The present disclosure relates to the development of total reflection reflectors for the construction of various solar concentrators or other type of concentrating systems with large concentrating ratios for simultaneous production of electrical power and thermal power. The various solar concentrators include concentrative Total Reflection Reflectors with Curved Rectangular Total Reflection Prisms; the TRR disclosed herein do not present the optical imperfection of diffusion and poor focusing of solar rays, in contrast to conventional TRR with rectangular total reflection prisms.

The correction of this optical imperfection can allow the construction of Parabolic TRR made of common transparent glass with large dimensions (height and width ranging from 2-10 mm or larger) of the rectangular prisms of the Parabolic TRR, as it is technically necessary for the glass-based technology, while simultaneously allowing the possibility of excellent focusing with large (real) concentrating ratios (500 or 1000 suns or even more). In addition, the correction of such optical imperfection can made possible the use of Secondary Parabolic or Ellipsoidal Total Reflection Reflectors for the shrinkage of the solar image's size and the achievement of even larger (real) concentrate ratios (over 1500 suns) as well as the creation of the Narrow Secondary Beam of Rays with beam-angles sized from 5°-10° for the injection of the solar radiation into Solar Wave guides for transferring the solar radiation inside buildings for solar lighting therein. Moreover, correction of such optical imperfection allows the construction of Solar Wave Guides with minimum losses for efficient transmission of the solar radiation to sufficiently long distances with an acceptable loss-level (e.g., acceptable losses for internal lighting of buildings with solar light).

BRIEF DESCRIPTION OF THE DRAWINGS

Drawing 1a presents a full parabolic Total Reflection Reflector.

Drawing 1b presents a detail (Detail A) of Drawing 1a related to the formulation of the Curved Rectangular Prisms for the correction of the diffusion imperfection of the conventional Parabolic Total Reflection Reflectors; the diffusion imperfection due to the simple Rectangular Prisms.

Figure 1A:
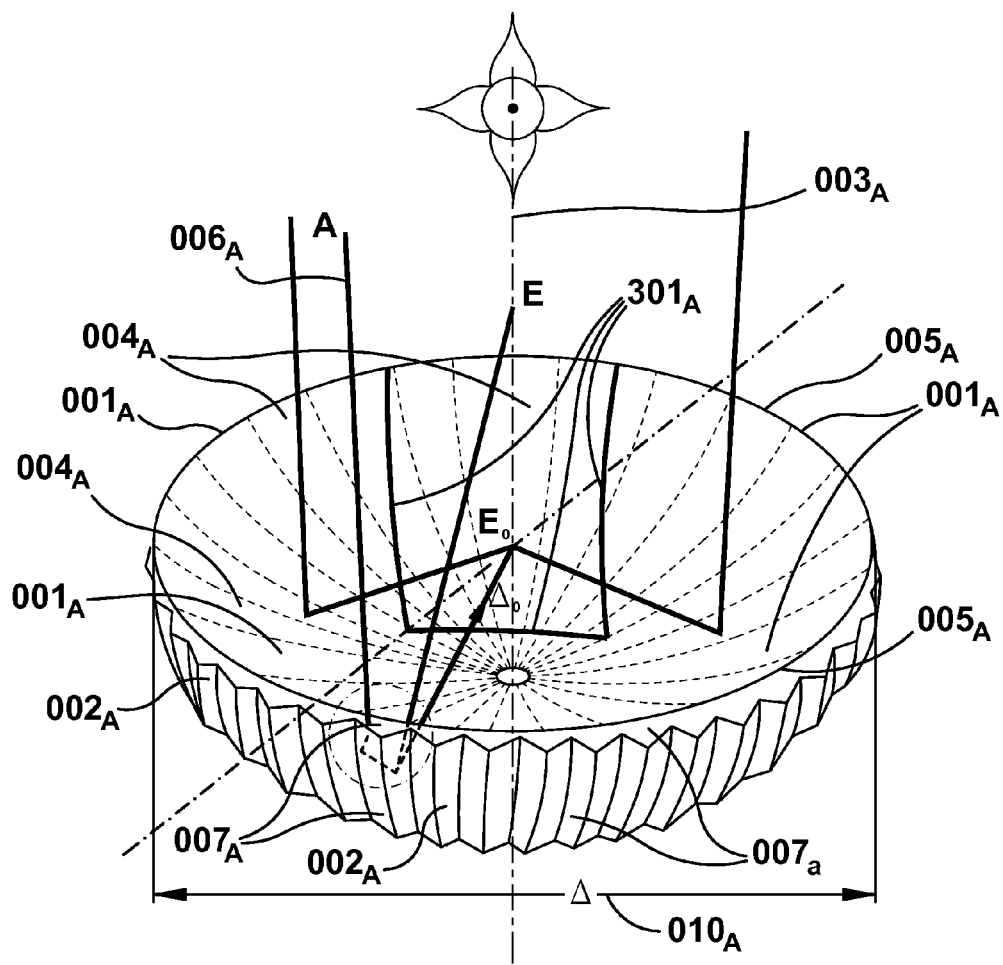
Figure 1B:
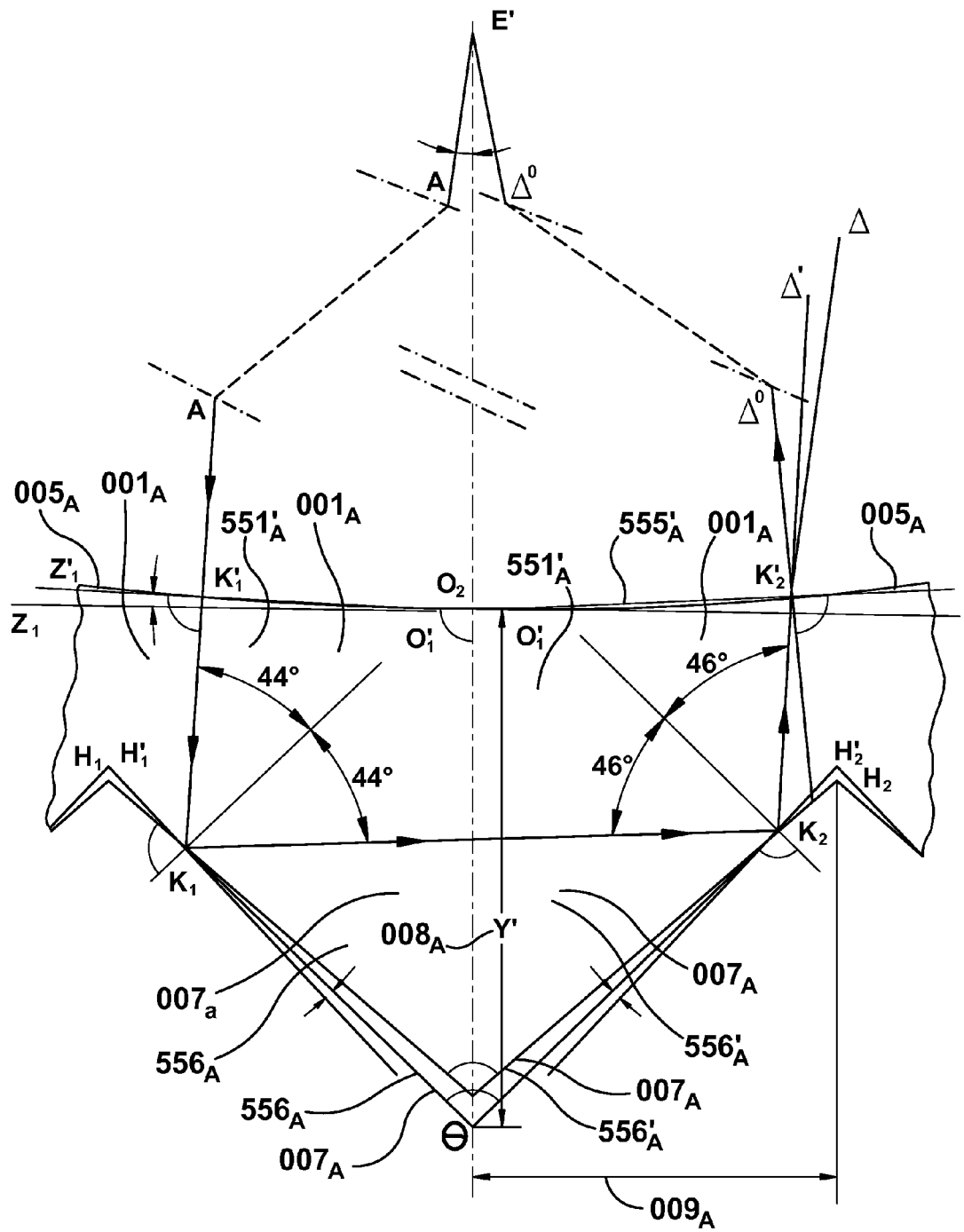
Figure 1C:
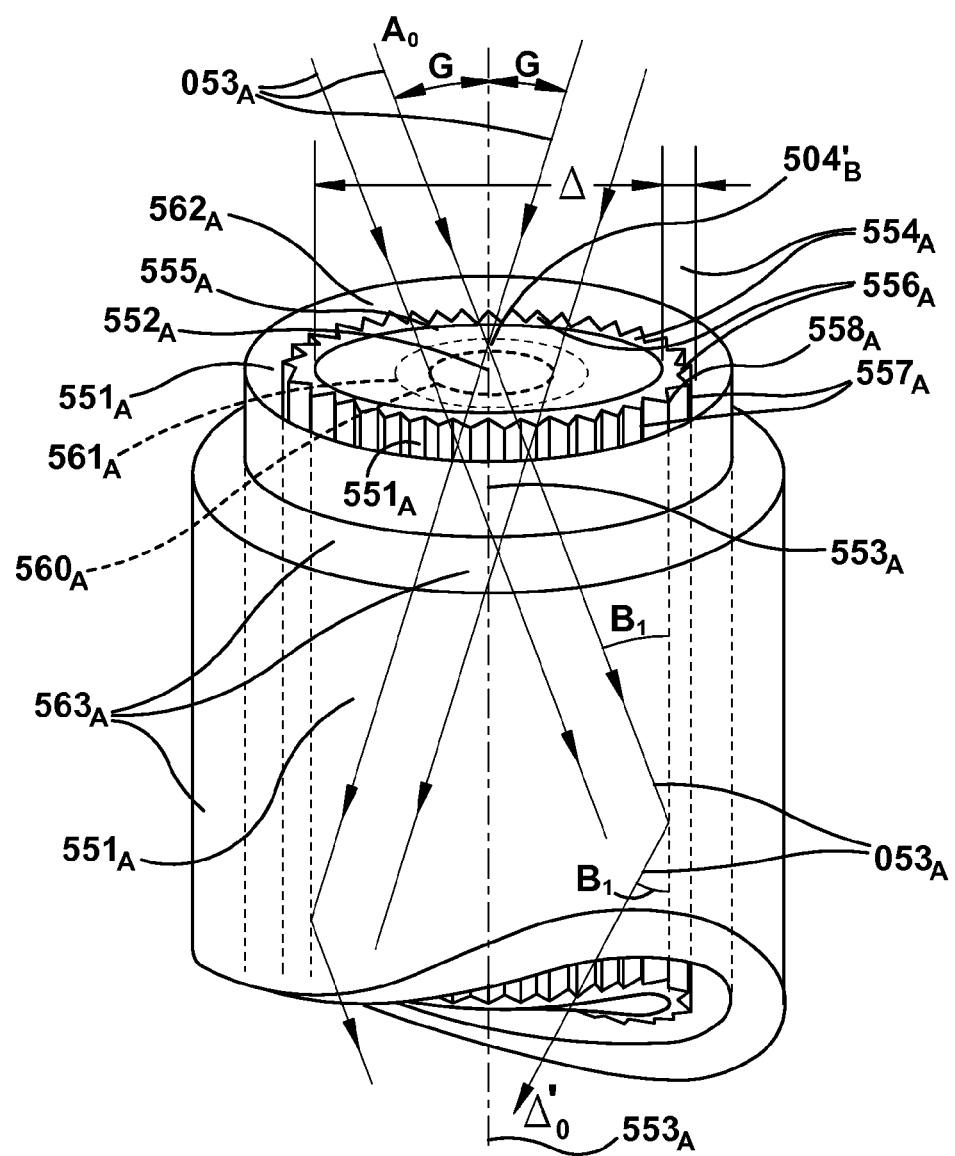
Figure 1D:
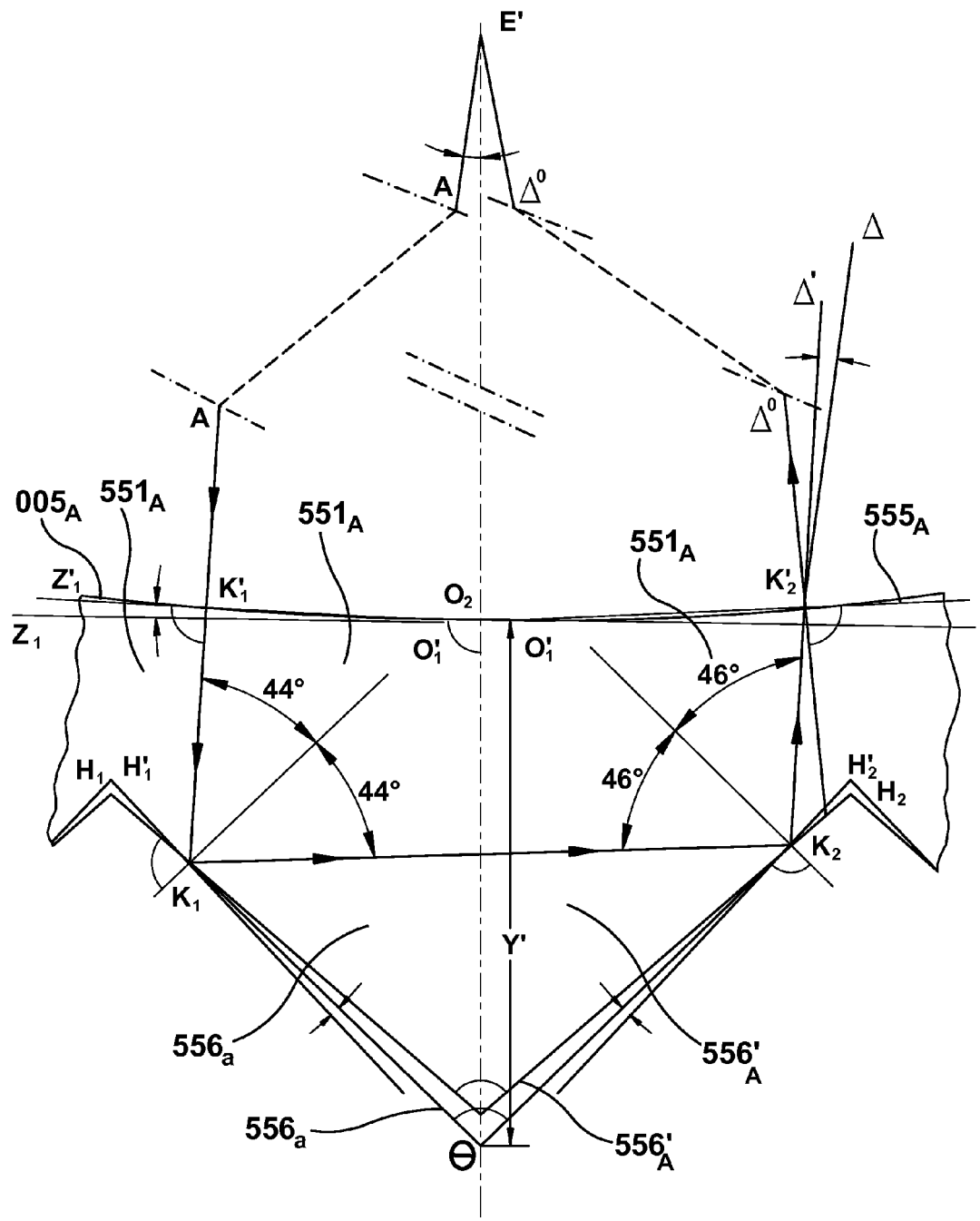
Figure 2:
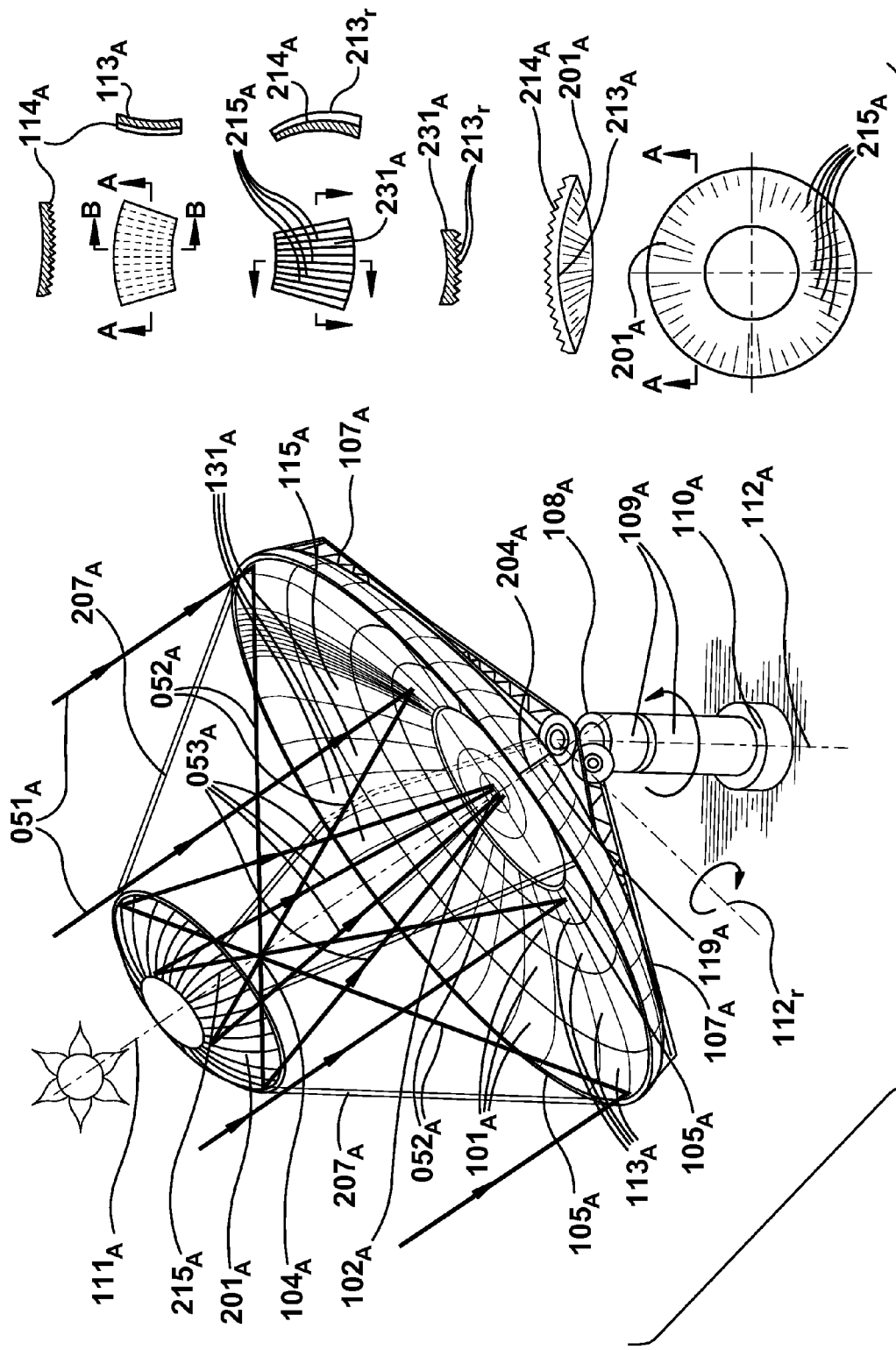
Figure 3A:
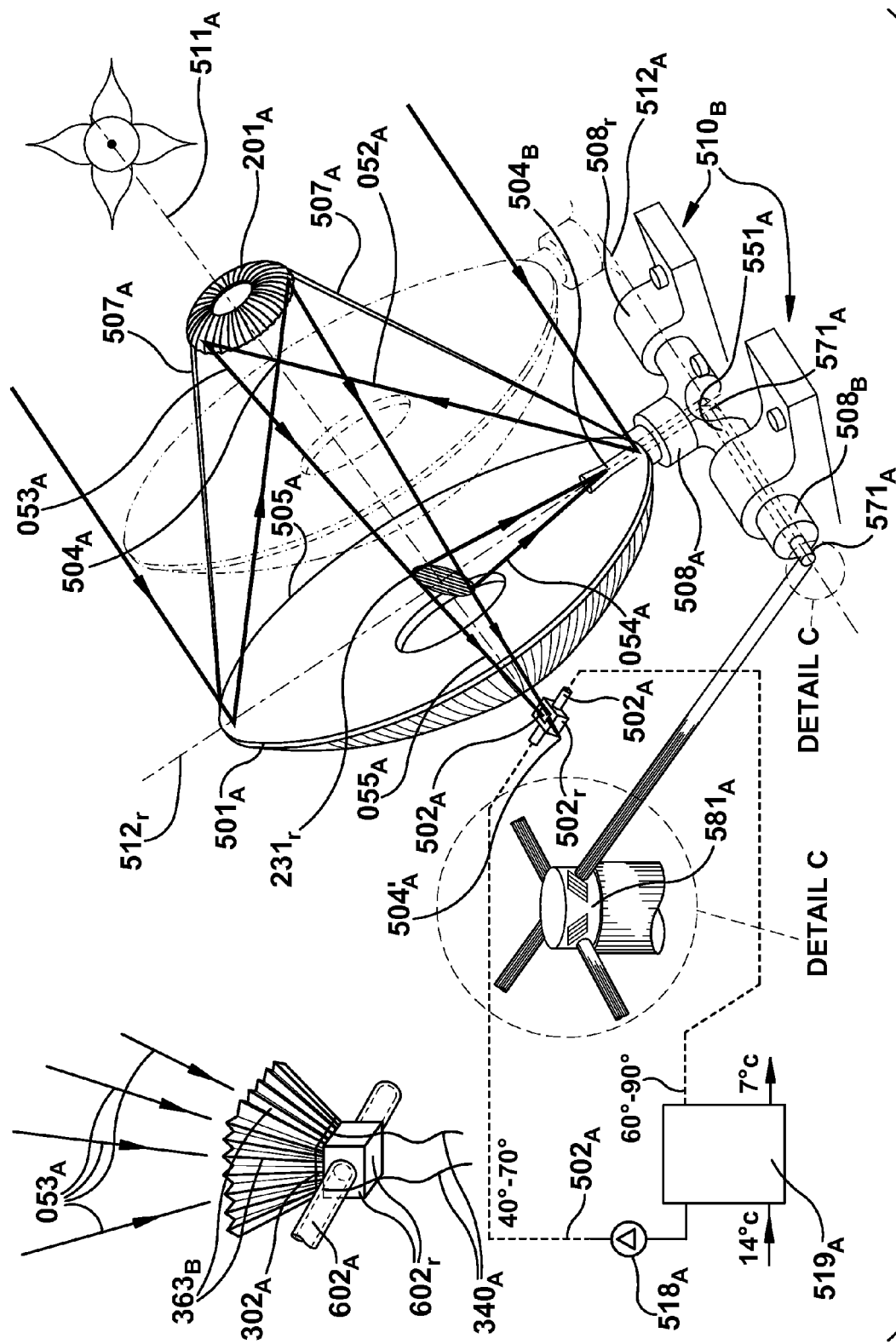
Figure 3B:
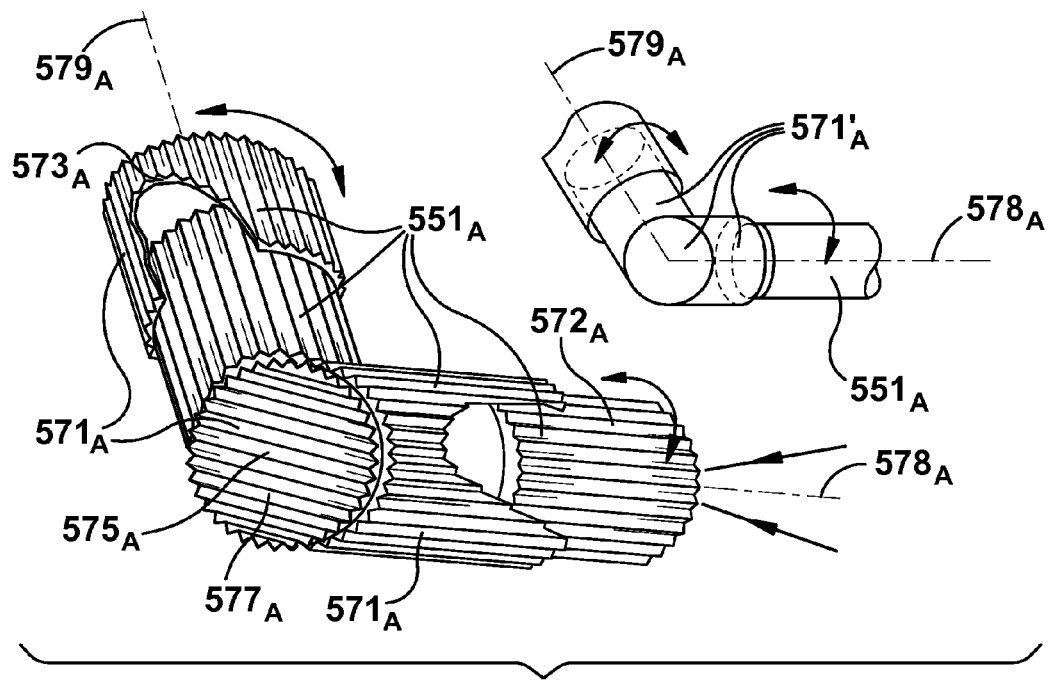
Figure 3C:
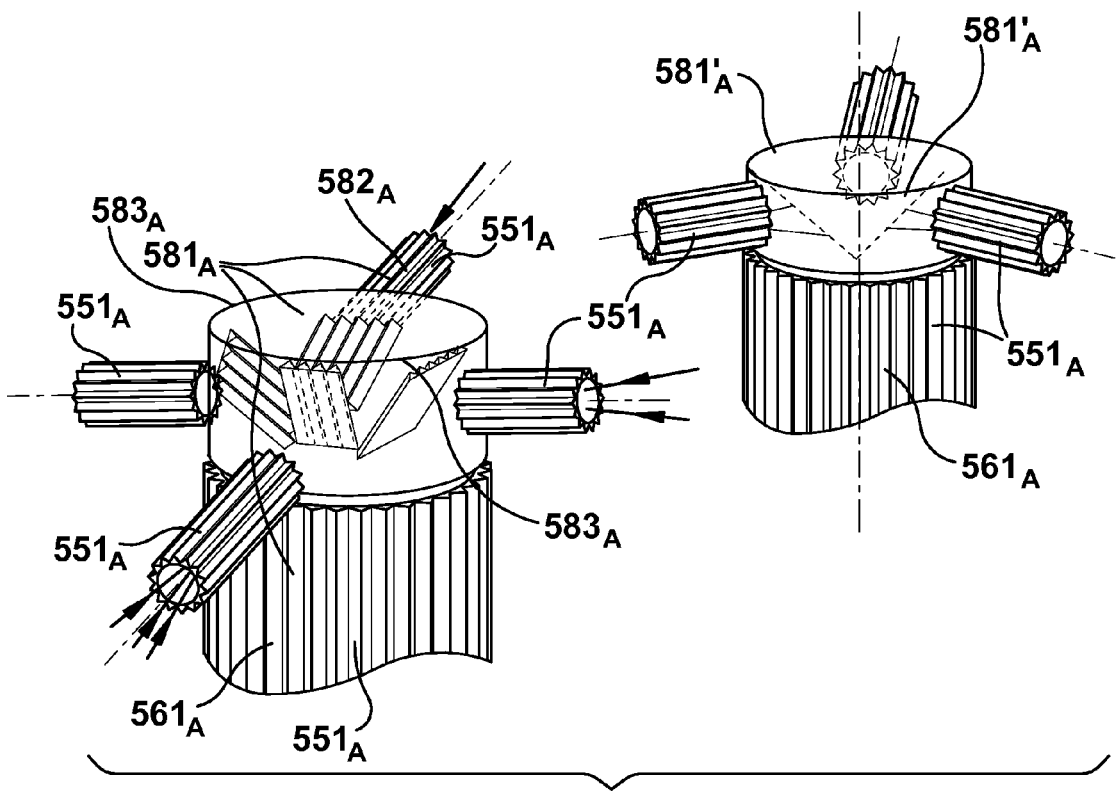

In Drawing 1c, the typical construction of a hollow Solar Wave-guide with total reflection walls (Solar Artery) is presented.

Drawing 1d presents a detail (Detail A') which shows the implementation of the Curved Rectangular Prisms, which removes the diffusion imperfection of the conventional Solar Artery; the diffusion imperfection related to simple conventional Rectangular Prisms.

Drawing 2 presents a Solar Concentrator System S/S ($100_A$) that concentrates solar energy and transforms it into a Narrow Beam for the production of electrical and thermal energy or the injection into hollow Solar Wave-guides (Solar Arteries).

Drawing 3a presents a Solar Concentrator System S/S ($500_A$) where a Solar Artery is also used to transfer solar energy into the building for solar lighting.

Drawings 3b and 3c present an Angular Accessory ($571_A$) and Multiple Angular Accessory ($581_A$) for supplying solar radiation into Solar Arteries.

DETAILED DESCRIPTION

Below is given the detailed technical description of the Solar Concentrator Systems S/S $500_A$, $100_A$, $600_A$, equipped with the novel corrected parabolic Total Reflection Reflectors (TRR) $001_A$ with corrected Hollow Rectangular Prisms (HRP) $007_A$ or $007'_A$ and with the novel Solar Arteries $551_A$ with corrected Hollow Rectangular Prisms $556_A$ or $556'_A$ for the removal of the optical imperfections diffusion and bad focusing typically present in the conventional parabolic TRR and Solar Arteries (because of the simple Rectangular Prisms), and the achievement of high solar radiation concentration.

1. Solar Concentrator System of Single Point Focusing S/S ($500_A$) for Solar Lighting, Air-Conditioning and Water-Heating in Buildings The Solar Concentrator System S/S $500_A$, which is shown in the Drawings 1a, 1b, 1c, 1d, 2 and 3a, 3b, 3c, is characterized by the fact that it is equipped with corrected Primary Parabolic Total Reflection Reflector $501_A$ and Secondary Ellipsoidal Reflector $201_A$ as well as the corrected Solar Arteries $551_A$ and the Accessories of the Arteries $571_A$ and $581_A$, which are all equipped with Curved Rectangular Prisms (CRP) $007_A$, CRP $007'_A$ and $556_A$ correspondingly, as all these are shown in the Drawings 1a, 1b, 1c and 1d, and as they are described in Sections 4 and 5 below. The Solar Concentrator System S/S $500_A$ removes optical imperfections (e.g., diffusion and poor focusing) of simple, conventional rectangular total reflection prisms.

The Solar Concentrator System S/S $500_A$ also is characterized also by the fact that it is designed for the supply of Solar Lighting in a building and the simultaneous production of cooling and thermal energy.

Construction of the Structural Elements of the Solar Concentrator System S/S $500_A$ also characterizes it. Such construction is effected as it is described below:

The primary Parabolic Total Reflection Reflector (PTRR) $501_A$ (which also is referred to as $101a$) consists of a full parabolic reflector or an extract of any form of the full reflector. The primary PTRR $501_A$ can consist of for example 1,2, 3,4 or even more Tiles of Total Reflection (TTR) $131_A$ based on an appropriate parabolic substrate, each one of the TTRs with main dimensions of about 20 cm by about 20 cm (e.g., 20 cm×20 cm) so that the (TRR) $131_A$ can be produced at a low cost by existing automated glass-impression machines. The material of the PTRR $501_A$ and TTR $131_A$ consists, e.g., of transparent glass without iron oxide or of transparent plastic self-supporting or supported on an appropriate substrate (as it is shown in the Drawings 2 and $3a$).

The Front Surface $113_A$, of the TRR $131_A$ has a smooth parabolic form, while the Rear-Surface ($113_\Gamma$) is also parabolic and bas-relief and consists of Corrected Rectangular Prisms $007_A$ (which also are referred to as $114_A$), of which the Top Acmes $115_A$ converge and meet at the Top $102_A$ of the full Parabolic Total Reflection Reflector $101_A$, which coincides here with the primary PTRR $501_A$. The cross-sections of the sides of the Corrected Rectangular Prisms CRP $114_A$ or $007_A$ are not straight lines but are the corrected curves of the CRP $114_A$ or $007_A$ so that an accurate focusing is achieved.

The S/S $500_A$ has a Symmetry Axis $551_A$, which points to the sun, and the Rotation Axes $512_A$ and $512_\Gamma$, which are horizontal and vertical axes, respectively. The primary PTRR $501_A$ is based on a metallic Supporting Frame $505_A$ (e.g., structured as the parabolic plate of a satellite television antenna made of pressed aluminum sheet). The Supporting Frame $505_A$ is based on the Vertical Rotation Mechanism $508_A$, which is based on the Horizontal Rotation Mechanism $508_B$ (analogous with the mechanisms $108_A$ and $109_A$ described below). Two Bearings $508_\Gamma$ enable the Supporting Fram $505A$ to be based on the Supporting Base $510_B$.

The Secondary Total Reflection Reflector (STRR) $201_A$ consists of a full paraboloidal or ellipsoidal reflector depending on whether the STRR $201_A$ is placed in front of or behind the Focus $504_A$ or $104_A$. In the illustrated embodiment, the STRR $201_A$ is placed behind the Focus $504_A$ and it is ellipsoidal. In the alternative, the STRR $201_A$ can be an extract of any shape [analogous of the corresponding ($501_A$)]. The STRR $201_A$ is made of the same material as the corresponding $501_A$. The STRR $201_A$ can also consist of, e.g., 1,2,3,4 or even more Total Reflection Tiles (TRT) $231_A$, as illustrated in Drawings 2 and 3, and which are based on the metallic Supporting Frame $507_A$ which is based on the Supporting Frame $505_A$.

The Front Surface $213_A$ of the TRT $231_A$ has a smooth ellipsoidal (or ellipsoid of revolution) form while the Rear Surface $213_\Gamma$ is also ellipsoidal and bas-relief and consists of Corrected Rectangular Prisms $214_A$. The Acmes $215_A$ of the CRP $214_A$ converge to the Top ($202_A$) of the ($201_A$), while the cross-sections of the Sides ($233_c$) of the Corrected Rectangular Prisms (CRP) $214_A$ are not straight-lines but they are the corrected curves of the CRP so that accurate focusing is accomplished.

The primary Total Reflection Reflector $501_A$ (corrected with CRP $007_A$) creates the Wide Beam of Rays $052_A$, which impinges onto and is reflected backwards by the Secondary Reflector $201_A$, which in the illustrated embodiment is designed ellipsoidal (or of ellipsoid-of-revolution shape) in appropriate size and is placed behind of the Focus $504_A$, so that it reduces the solar image to a desirable level, and creates the Narrow Beam of Rays $053_A$ with a desirable beam angle (e.g. smaller than ±5°).

Solar Concentrator System S/S $500_A$ also possesses a Reflection Medium ($231_\Gamma$) of the Narrow Beam of Rays $053_A$ before it focuses on the Focus $504'_B$ (e.g. a Total Reflection Reflector with parallel rear surface total reflection prisms) placed at a 45° angle towards the Narrow Beam Axis $053_A$, close and behind the Focus $504'_B$ and close to the Entrance of the Solar Artery $551_A$, so that the Reflection Medium $231_\Gamma$ reflects the Narrow Beam $053_A$ into the Solar Artery $551_A$, which is placed with its opening close to the Focus $504_A$ of the reflected Narrow Beam $053_A$ and its Axis $553_A$, which is parallel to the axis of $053_A$. In those occasions or during that time of the day when the Solar Lighting is not needed inside a building, the TRR $231_\Gamma$, or other installed TRRs, may be removed, and thus the Narrow Beam can focus directly onto a selective black absorbent surface $562_A$ which is placed on the Focus $504'_B$ which can transfer the heat of the Beam $053_A$ into the Working Fluid $502_E$, which can be utilized as hot water or as cooling power used for air-conditioning through the Adsorption Heat Pump $519_A$ with Silicagel, etc].

Alternatively, the Reflection Medium $231_\Gamma$ may be a Cold Mirror $231_\Gamma$ at a 45° angle towards the Narrow Beam Axis $053_A$, and need not be close to the Focus $504'_B$ or close to the Solar Artery $551_A$. Cold mirror $231_\Gamma$ can only reflect the visible part of the solar radiation spectrum (from $\lambda=0.4$ until $\lambda=0.7$ µm) with a coefficient of reflectivity above 96%, at an angle of 90° towards the Solar Artery $551_A$ (which is placed with its Opening at the Focus $504_A$ of the Narrow Beam $053_A$ and its Axis $553_A$ parallel to the axis of $053_A$), while Cold Mirror $231_\Gamma$ will allow the infrared (IR) part of the spectrum (from $\lambda=0.7$ to $\lambda=2.4$ µm) to get through it with few absorption losses of the order of 5-10%. The IR part of the Narrow Beam $053_A$ will focus straight onto a selective black Absorbing Surface $562_A$ placed at the Focus ($504'_A$), which will transfer the heat of the IR Beam $053_A$ to the Working Fluid $502_E$ (which will be utilized as hot water or as cooling power used for air-conditioning through the Adsorption Heat Pump $519_A$ with silicagel, etc.) avoiding at the same time transferring the heat of the IR part of the solar radiation spectrum into the building, saving in that way the corresponding power of the chiller of the air-conditioning units of the building.

The reflected Narrow Beam of Rays $053_A$ will be focused on the Center ($552_A$) of the Solar Artery ($551_A$), which is placed close to the final Focus ($504_B$) with the Axis ($553_A$) of the Solar Artery parallel to the Narrow Beam Axis ($053_A$). The Solar Artery ($551_A$) is constructed as described below in Section 5. Subsequently, the Narrow Beam $053_A$ of the total or just of the visible part of the solar radiation spectrum, through the Solar Arteries $551_A$ is transferred to the interior of the building so that it is used for natural lighting through special Solar Lighting Fixtures (SLF) $591_A$.

For one or many primary Reflectors $501_A$ concentrating the Solar Radiation, which have been arranged on a fixed basis or on a rotating basis, which floats, the Solar Arteries $551_A$ of each Basic Reflector $501_A$ are gathered through Angled Accessories $571_A$ to the Main Multiple Angled Accessory $581_A$ with which each Solar Beam $053_A$ of the Solar Arteries $551_A$ of each Basic Reflector $501_A$ are inserted into the Main Artery $551'_A$ and transferred to the interior of the building where the Solar Radiation ($053_A$) is distributed in reverse way to each floor by Multiple Angled Accessories $581_A$ to smaller Arteries that transmit the light to the rooms intended to be illuminated and wherein the final distribution to lighting fixtures is effected either by Solar Arteries $551_A$ of small diameter or by optical fibers of large diameter.

For the achievement of constant level of lighting into the rooms, when the intensity of the available solar radiation changes, there will be conventional fluorescent lamps which through a dimmer will keep the lighting level constant, increasing or decreasing correspondingly the lighting flux of the fluorescent lamps.

A first approximation of the energy production or the energy substitution resulting from the Solar Concentrator System S/S $500_A$ in the case of using the Cold Mirror $231_\Gamma$ is the following:

Each KW of incoming solar radiation corresponding to solar radiation received at an Ideal Solar Location (ISL) with 0% diffuse radiation and 100% straight radiation at noon with clear sky and AM1.5, and with an aperture of one square meter of primary Reflector $501_A$, when it is split into visible and infrared (IR) radiation, it will provide approximately 500 W visible and 500 W IR radiation. From the 500 W of visible light, using Total Reflection Reflectors and the Solar Arteries described above, approximately 80% of that radiation will be transmitted to the Solar Lighting Fixtures $591_A$ inside the building. It is known that each W of visible solar light corresponds to 200 μm (compared with approximately 60 μm/W for the state of the art fluorescent lamps which are used for the internal lighting of the buildings). Accordingly, 400 W of transmitted visible light will give 80,000 μm which will substitute 80,000/60=1330 W of electrical energy (=33 fluorescent lamps of 40 W). Moreover they will substitute another 400 W of electrical energy, which would have been required from the air-cooled chillers (with COP=2.3) in order to remove 1330-400=930$W_{th}$ thermal load, which remains behind due to the operation of the 1330 W fluorescent lamps.

On the other hand, the IR radiation that focuses at the Focus ($504_B$) on the Absorbing Surface ($562_A$) will have approximately 15% losses due to reflection and absorption at the Cold Mirror $531_\Gamma$ and emission from the Selective Absorbing Surface ($562_A$). Which means that the power of the IR radiation which will be delivered to the Absorbing Surface $562_A$ will be equal to 500×0.85=425 W. The latter power will be transferred by the Heating Pump $519_A$ (Absorbing or Adsorbing) to the Working Fluid $502_E$ as above, producing 425 $W_{th}$ of hot water during the winter, or it will be transformed into cooling power (as chilled water, with COP 0.7 till 0.9 average 0.8 due to the higher permissible temperatures of hot water) equal to 435×0.8=340 W for air-conditioning units during the summer, thus substituting 340/2.3=150 W of electrical power of the air-cooled chillers, which would have been required by them for the same cooling power. At the same time, the Silicagel Adsorption Heat-Pump $519_A$ (which can transform hot water of 60°-90° C. into cold water of 7°/12° C. for air-conditioning with a COP of 0.7 approximately) will produce in parallel an intermediate stream of lukewarm water of 30°-32° C. from the condensation of the water vapor during the adsorption cycle with a thermal power of approximately 425 W, appropriate for pool-heating or for warming-up of domestic hot water etc. The total attribution of the IR part of the solar radiation will be 150 W of substituted electric energy of air-conditioning plus 425 W of lukewarm water during the summer or 425 W of hot water during the winter.

Thus, the Solar Concentrator System S/S ($500_A$) can produce or substitute for each KW of incoming Solar Energy (which corresponds approximately to 1 m² of aperture surface of a primary Reflector for an ISL):

For the part of the Visible Spectrum
   1330 W of substituted electrical energy for building lighting (substitution of 33 fluorescent lamps approximately)
   400 W of substituted electrical energy for air-conditioning For the part of I/F Radiation (only hot water and air-condition without P/V):
   150 W of substituted electrical energy for air-conditioning plus
   425 W for the production of lukewarm water during the summer and
   425 W for the production of hot water during the winter Total: 1880 W of substituted electrical energy and 425 W of lukewarm water during the summer and 1330 W of substituted electrical energy plus 425 W of hot water during the winter. This means more than 2.30 KWp during the summer and approximately 1.75 KWp during the winter of substituted or produced electrical and thermal energy for each KWp of incoming solar energy.

Compared with conventional PN Systems, which produce approximately 120 to 180Wp of electric energy for each 1000 Wp of incoming solar energy, the present Solar Concentrator System S/S $500_{A, B}$ produces or substitutes more than 10 times in electrical and 3 times in thermal or cooling power (for hot water or air-conditioning power) in an affordable price, which will allow the amortization of the Solar Concentrator System S/S $500_A$ in less than 3 years, even without incentives.

2. Solar Concentrator System of Single Point Focus S/S $100_A$

The S/S $100_A$, which is described herein and shown in the Drawing 2 is characterized by the fact that it includes a full primary Parabolic Reflector of Total (or even simple conventional) Reflection (PRTR) $101_A$ with Top the point $102_A$. In the S/S $100_A$, the Solar Rays $051_A$, after their incidence on the primary PRTR ($101_A$), create the first reflected Wide Beam of Rays $052_A$, which focus on the Focus $104_A$ and either they are utilized directly there focusing on the P/V Cells $302_A$ with the help of the Auxiliary Reflector $363_A$ or alternatively after they reflect on the Secondary Reflector $201_A$ (which is supported with the Brackets $207_A$ on the Ring $105_A$), they create the Narrow Beam of Rays $053_A$, which reaches the Final Focus $201_A$ and focuses there on the P/V Cells $302_A$ with the help of the Auxiliary $363_B$ as well, which are based on the Ring $105_\Gamma$. The Reflector $101_A$ is based on the metallic Supporting Rings $105_A$ (External) and $105_C$ (Internal), which are supported by the metallic Supporting Brackets $107_A$, which are based on the Horizontal Rotating Head $108_A$. The Head $108_A$ is based on the Pillar/Vertical Rotating Mechanism $109_A$, which is based on the Base $110_A$.

The Total Reflection Reflector $101_A$ consists, e.g., of transparent water-clear glass without iron oxides (one-piece for small surfaces, or Total Reflection Tiles (TRT) $131_A$, which consist part of the Parabolic Surface $113'_A$ for larger surfaces based on an appropriate parabolic substrate) or of transparent plastic self-supporting or based on an appropriate substrate. The Front Surface $113_A$ of the $113'_A$ has a smooth parabolic form, while the Rear Surface $113_\Gamma$ has a bas-relief parabolic form and is parallel with the $113_A$ and consists of Corrected Curved Rectangular Prisms $114_A$ or $007_A$, of which the Top Acmes $115_A$ converge and meet at the Top $102_A$ of the Reflector $101_A$. Moreover we have the Symmetry Axis $111_A$ (which aims to the Sun) and the Rotation Axes $112_A$ and $112_\Gamma$ (Vertical and Horizontal, respectively).

The Secondary Reflector $201_A$ has a paraboloid or ellipsoid form by rotation (depending on whether it is placed in front or in the back of the corresponding Focus $104_A$ or $504_A$; in the illustrated embodiment, it is designed as an ellipsoid for reducing the solar image) and may consist of 1,2,3,4 or even more Total Reflection Tiles (TRT) $231_A$. For TRT $231_A$, the Front Surface $231r$ is smooth ellipsoid, while the Rear Surface $(213_\Gamma)$ is bas-relief ellipsoid and parallel to the $213_A$, and consists of Corrected Curved Rectangular Prisms (CRP) $214_A$, of which the Top Acmes $215_A$ converge and meet at the top $202_A$ of the Reflector $201_A$.

3. The Solar Concentrator System S/S $600_A$ for Solar Lighting, Solar Air-Conditioning, Solar Water Heating and Electrical Energy from P/V.

The Solar Concentrator System S/S $600_A$ which is shown in the Drawings 3a, 3b, 3c is constructed like the Solar Concentrator System S/S $500_A$, but it is characterized by the fact that it is designed for the production of Electrical Energy on in addition to Solar Lighting and the production of Cooling or Heating power of the S/S $500_A$ by adding the Structural Elements which are related to P/V (the P/V Cells ($302_A$), the focus Auxiliary Reflectors (363A), the Cables ($340_A$) and the batteries or the Inverters) to those ones of the S/S $500_A$ as mentioned below. All the Structural Elements (S/E) of the S/S $600_A$, which are similar to those ones of the S/S $500_A$ and to those ones of the S/S $100_A$, are named with the same names and code numbers as the corresponding of the S/S $500_A$ and S/S $100_A$, but they change the first code number from the 5 or 1 to 6 (for example, the Vertical Rotating Axis $512_A$ of the S/S $500_A$ changes to $612_A$ in the S/S $600_A$, while the $302_A$, $363_A$ and $340_A$ of the S/S $100_A$ change to $602_A$, $663_A$ and $640_A$ in the S/S $600_A$ correspondingly) and are modified correspondingly for the functional form of the S/S $600_A$ (for example, the Absorbing Surfaces $662_A$ do not need any more to be covered with selective absorbing radiation layer and the P/V Cells $602_A$ may be sensitive to the IR).

For this purpose the P/V Cells IR $602_A$, the Cables and the Auxiliary Reflectors $663_A$ are added on top of the heat Absorbing Surfaces $662_A$ behind the Cold Reflector 631, on the Final Focus $604_B$, thus exploiting the incident concentrated radiation first for the production of P/V electrical energy and afterwards for the production of hot water as above.

4. Corrected Parabolic and Paraboloid or Ellipsoid Total Reflection Reflectors with Curved Rectangular Prisms.

In the following, a detailed technical description of the construction of the novel parabolic Total Reflection Reflectors (TRR) ($001_A$) with Curved Rectangular Prisms (CRP) ($007_A$) for the correction of the optical imperfection of diffusion and poor focusing of the conventional parabolic TRR (due to the simple rectangular prisms) and the accomplishment of high concentration ratios is provided.

In Drawing 1a, a full parabolic Total Reflection Reflector ($001_A$) is shown, which is characterized by the fact that it is equipped with the exterior Bas-relief Surface $002_A$, which bears Curved Rectangular Prisms (CRP) $007_A$ as they are shown in the Drawing 1b. In the Detail A in Drawing 1b, the Rectangular Prism $H_1\Theta H_2 = 007_A$ is shown, which arises from a section of the External Surface ($002_A$) with the Plane $013_A$ normal to the tangential of the Acme $012_A$ of the (not yet corrected) Rectangular Prism $007_A$ at the Point O. The plane $013_A$ is normal to the Internal Surface $004_A$ at the point $O_1$ and its section with the ($004_A$) in the area of the Point $O_1$ is with great approximation a Periphery $\Pi_1$ of a circle with a radiant $O_1E = \sqrt{2} \times O_1E_0$.

For the sake of simplicity, it is assumed that the Focus $E_0$ of the ($001_A$) is located on the section of the Plane $005_A$ with the Axis $003_A$, that the Point $K'_1$ is located on the Periphery ($005_A$) and that the Periphery $H_1=(013_A)$ has a Diameter $\Delta_1 = 360$ cm/p=114.6 cm and, consequently, the length of the Periphery $\Pi_1 = 013_A$ equals with $$\frac{360}{\pi}\pi = 360 \text{ cm.}$$

Further assuming that the parabolic TRR ($001_A$) includes 150 Rectangular Prisms ($007_A$), results that the width of each Rectangular Prism ($007_A$) corresponds on the $H_1=(013_A)$ to an arc with length of 2.4 cm or to an angle $\phi=2.4°$.

It is considered the vector Component $AK_1$ of the incident Solar Ray $006_A=A_0K'_{10}$, which coincides with the section $K'_1E$ of the plane that is defined by the incident Solar Ray $(006A)=A_0K^1_{10}$ in combination with its parallel Axis $003_A$ of the (not corrected yet) parabolic TRR $001_A$ with the Plane $013_A$. The Ray $AK'_1=K'_1E$ falls vertical on the Periphery $013_A$ at the point $K'_1$ at the area of the (not corrected yet) Rectangular Prism $007_A$ (where $O_1K'_1=1.0$ cm and) ($k_1=1°$, penetrates at a straight line to the interior of the Rectangular Prism $007_a$ and falls onto the Side $H_1\Theta$ to the point $K_1$ under an angle of 44° to the vertical $K_1\Lambda_1$ and is reflected under an angle of 44° and intercepts the Side $QH_2$ at the point $K_2$ under an angle of 46° to the Vertical $K_2\Lambda_2$ and is reflected under an angle of 46° to it and emerges from the TRR $001_A$ at the point $K'_2$ under an angle of 3° as to the $K'_2\Delta''_0$ (which is vertical to the Tangent $K'_2O_1''$ of the Periphery $\Pi_1=013_A$ at the Point $K'_2$). The Vertical $K'_2A''$ comes through the Center E of the Periphery $\Pi_1=013_A$ and is the desirable route of the projection of the emerging Ray $K'_2\Delta$ in order that it focuses at E and consequently the real Ray $K'_{20}\Delta''_0$ focuses at $E_0$[1].

[1] For this analysis, it has been assumed a diffraction coefficient n=1.5 for common transparent glass and that $\sin \phi_4/\sin \phi_3 = 1.5 = \phi_4/\phi_3$ with a very good approximation due to the very small angles $\phi_4$ and $\phi_3$.

Accordingly, it is proved that a conventional Rectangular Total Reflection Prism presents an aberration angle $\phi_4$ (Convergence Aberration) of the emerging vector component Ray $K'_2\Delta$ (after the Total Reflection of the vector component Ray $AK'_1$ as above) as to the desirable routing $K'_2\Delta''$ for accurate focusing that is equal to $3\phi_1$ (where $\phi_1$ is the angle that corresponds to the arc $O_1K'_1$), and the same Convergence Aberration presents the real emerging Ray $K'_{20}\Delta''_0$. It is therefore obvious that due to the existence of the Convergence Aberration ($\phi_4=3\phi_1$, in order to have a tolerable Focusing with conventional (not corrected) parabolic TRR, these must be obligatorily of a very small thickness wall, e.g., of colorless plastic (acrylic, etc.) and the height and width of their Rectangular Prisms to be as small as possible so that the Convergence Aberration is as small as possible correspondingly, [because the $\phi_1$ is almost straight proportional with the height $008_A=\frac{1}{2}$ width of $009_A$ of the corresponding Rectangular Prism $007_A$ for a given Diameter $D=010_A=005_A$ of the Parabolic TRR $001_A$].

In contrast in the parabolic TRR made of common water clear glass with n=1.5 and dimensions of height-width of the Rectangular Prism of the order of 2-10 mm as above, if the correction of the Convergence Aberration $\phi_4=3\phi_1$ will not be done with Curved Rectangular Prisms $007_A$ as given below, then the Convergence Aberration for the previous example with Periphery $\Pi_1=013_A=114.6$ cm and $$D = 005_A = \frac{114,6}{\sqrt{2}} = 81 \text{ cm}$$

and Height $008_A = \frac{1}{2}$ Width $009_A$ of the Rectangular Prism in the Periphery $\Pi_1 = 013_A$ equal to 1.2 cm, incidence of the Ray A at a distance $O_1K_1 = 1.0$ cm from the Point $O_1$ and Focusing Distance $$K'_{20}E_0 = \frac{114,6}{\sqrt{2}} = 81 \text{ cm},$$

we will have $\phi_1 = 1°$ and $\phi_4 = 3°$ and an aberration of the Reflected Ray $K'_{20}\Delta_0$ from the Point $E_0$ of the Focus equal to 81*tan 3°=4.25 cm (for Rays $A_1$ incident to the Point $H_1$ the aberration grows larger than 5.1 cm). Consequently the theoretical ratio of concentration is limited below 250 (and in the reality due to imperfections of the projection the Solar Image etc even more) with a consequence that such a parabolic TRR is completely inappropriate for PN Concentrating Systems with concentrating ratios larger than 200 or even less.

Therefore in order to have an accurate focusing of the Emerging Ray $K'_{20}\Delta''_0$, this and the vector component Ray $K'_2\Delta$ must take the direction of the straight line $K'_2\Delta''$ which is vertical to the tangent $K'_2O_1''$ at the point $K'_2$ and therefore passes through the Center of the Periphery $\Pi_1 = 013_A$ so that the real Ray $K'_{20}\Delta''_0$ comes through the Focus $E_0$ (in the following, and as above, the analysis will be made for the vector components on the plane of $\Pi_1 = 013_A$, which will be valid for the real Rays as well).

This means that the vector component $K'_2\Delta$ of the Ray $K'_{20}\Delta_0$ must be turned counterclockwise (to the left) by an angle of $\phi_4 = 3\phi_1$ and for n=1.5 the vector component $K'K'_2$ of the Ray $K_{20}K'_{20}$ in the Rectangular Glass Prism ($007_a$) must be turned counterclockwise by an angle of $3\phi_1/1.5 = 2\phi_1$ which means that the sides $H_1\Theta$ and $\Theta H_2$ must be turned at the points $K_1$ and $K_2$ (the $H_1\Theta$ clockwise (to the right) and the $\Theta H_2$ counterclockwise correspondingly) by an angle of $\phi_1/2$ each of them.

At the specific example above, in order to have the revolution of the vector component Ray $K'_2\Delta$ by an angle of 3° (so that it coincides with the vertical $K'_2\Delta''$ and route through the Focus E) the side $H_1\Theta$ must be turned around the point of total reflection $K_1$ clockwise by 1.0°/2=0.5° (consequently the vector component Ray $K_1K_2$ will be turned clockwise, according to the clock hands, by 0.5°×2=1.0°) and the side $H_2\Theta$ must be turned around the point of total reflection $K_2$ counterclockwise by 1.0°/2=0.5° (and consequently the vector component Ray $K_2K'_2$ will be turned counterclockwise, opposite to the clock hands, by 0.5°×2=1.0°). Thus, in total, the vector component Ray $K_2K'_2$ will be turned counterclockwise by 1.0°±1.0°=2.0° and the $K_2O$ will be turned counterclockwise by 2.0°×2=3.0° and will coincide with the direction $K_2O''$, which is vertical onto the tangent $K'_2O''_1$ at the point $K'_2$ (and consequently it will be routed through the Focus E). It is thus proved that in order to focus correctly the reflected rays emerging by total reflection from a parabolic or ellipsoidal or paraboloidal[2] reflector with a rear surface formulated into converging (at the top of the parabolic or ellipsoidal or paraboloidal reflector) rectangular prisms, then the sides of the rectangular prisms must be rectangular only in a small (dz) area around the top $\Theta'$ of each Curved Rectangular Prism $007_A$.

[2]The analysis is effected on the projections of the Rays $006_A$ on the plane of the $\Pi = 013_A$. Consequently are valid go what are mentioned also for the case of the paraboloidal or ellipsoidal (TRR) $001'_A$ onto which the incident rays $A' = 006'_A$ are not parallel to the Axis $003'_A$ of the $001'_A$ but they originate from a Point $012'_A$ of the Axis $003'_A$ of the Paraboloidal (TRR) $001'_A$.

At whatsoever other point of them the sides of each rectangular prism must appear, at their projection on a plane vertical to the Acme $012_A$ of the Parabolic TRR $001_A$, an angle of curvature ($\phi_2$ equal with the half of the angle $\phi_1$, where $\phi_1$ is the angle formatted by the tangent of the internal Periphery $\Pi_1 = 013_A$ at the point $K'_1$ as above with the tangent of the Periphery $\Pi_1 = 013_A$ at the Central Point $O_1$. This means that ($\phi_2 = \frac{1}{2}\phi_1$ at each point $K_1$ of the sides of a Curved Rectangular Prism $007_A$ where the relative each time $K_1$ corresponds to the each time Points of interception of the incoming vertically (onto the internal Periphery $\Pi_1 = 013_A$) vector components of the Rays $A_o$ onto the relative Side $H_1\Theta$ of the Rectangular Prism $007_A$ (the analysis is effected with the vector components of the rays on the plane of the $H_1 = 013_A$ as above.

In this way, each Side $\Theta'H'_1$ and $\Theta'H'_2$ of the Curved Rectangular Prism $H'_1\Theta H'_2 = 007_A$ made of for example common water clear glass (with a diffraction index n=1.5), it will present an increasing curvature in relation to the corresponding Sides $\Theta H_1$ and $\Theta H_2$ of the Rectangular Prism $H_1\Theta H_2$, whose angle of curvature $\phi_2$ at the each time Point $K'_1$ or $K'_2$ of the $O'H'_1$ and $O'H'_2$ will be equal with great approximation with the half of the corresponding angle $\phi_1$ at the each time points $K'_1$ or $K'_2$ of the internal Periphery $H_1$ as above, while at the top $\Theta'$ we will have a rectangular intersection of the $\Theta H'_1$ and $\Theta H'_2$.

The need for the construction of parabolic or ellipsoidal or paraboloidal TRR $001_A$ or $201_A$ or $201'_A$ with curved Rectangular Prisms as above, becomes even more compulsory when it desired to employ ellipsoidal or paraboloidal Secondary Reflectors $201_A$ or $201'_A$ or $231_A$ which must transfer the Focus $204_A$ or $504_B$ behind the Primary Reflector $001_A$ or $101_A$ or $501_A$ shrinking or reducing the Solar Image in order to accomplish large concentration ratios (over 1500 suns). In this case the focusing must be accurate both in the Primary as well as in the Secondary Reflector, which needs also relative Curved Rectangular Prisms $007_A$ as above, but where the exact relationship amongst the each angle $\phi_2$ and the corresponding angle $\phi_1$, both in the each time Primary and the Secondary Ellipsoidal or Paraboloidal Reflector, will be determined by a suitable Computer program depending on current needs of focusing as described above.

5. Corrected Solar Arteries and Solar-Arteries-Grid-Elements with Curved Rectangular Prisms Another application where the construction of TRR with Curved Rectangular Prisms is needed is the manufacturing of hollow Solar Wave-Guides (Solar Arteries) with small losses or small leakage of radiation to the outside, so that transportation of Solar Radiation in great distances with acceptable losses is achieved, for example for the transportation of solar radiation inside a building for the substitution of artificial with solar lighting. The Drawing 1c shows the typical construction of a hollow Solar Wave-guide with total reflection walls (Solar Artery). The Drawing 1d shows the Detail A, which shows the implementation of Curved Rectangular Prisms that raises the optical imperfection of diffusion in a conventional Solar Artery (due to the conventional Rectangular Prisms). The Solar Artery $551_A$ consists of a hollow Pipe with thin Walls $554_A$ from transparent material with very small absorption-factor of solar radiation for example special transparent plastics or other clear materials by which are manufactured optical fibers, as the PMMA or the fused silica or even transparent glasses without iron-oxides. The internal wall of the Pipe is smooth, cylindrical with a diameter from a few centimeters (or smaller) up to tens of centimeters (or bigger). The external wall of the pipe is bas-relief and is constituted by many, parallel between them (and to the axis $553_A$ of the Pipe), Curved Rectangular Prisms $556_A$ as these are defined below.

The Walls $554_A$ of the Solar Arteries have their Internal Surface smooth, cylindrical, while their external surface is also cylindrical, bas-relief with parallel and at the same time Curved Rectangular Prisms $556_A$, whose Acmes $557_A$ are parallel to the Axis $553_A$ of the Solar Artery and their Acmes-Angles $558_A$ will be 90° only in a small area near the Acmes-Angles $558_A$. The external surface of the Curved Rectangular Prisms $556_A$ will be covered with a suitable transparent Protective Layer $562_A$, as those that are used for the protection of the external surface of the optical fibers in the telecommunications and finally this will be protected by an External Plastic Mantle $563_A$. The diameter of the Solar Artery $551_A$ will be big enough so that the focused Narrow Beam $053_A$ at the end of the $551_A$ near the focus will be inside a circle of optical angle e.g. 10°-20°, when we look at it from the Periphery $555_A$ of the section of the Artery $551_A$ towards the section $552_A$ (dependent upon the index of refraction of the transparent material of the) Artery Walls $554_A$) in order to be inside the total reflection angle of the Curved Rectangular Prisms $556_A$ as well as the relative angle of the Solar-Arteries-Elements $571_A$ and $581_A$ equipped with Total Reflection Reflectors $571_A$ and $581_A$ as they are mentioned below.

A Beam of Rays $053_A$ (Beam) must enter into such a Solar Artery $551_A$ from its one end in such a way that the Focusing Point $504'_B$ of the Beam $053_B$ coincides with the Center of the Opening $552_A$ of the Solar Artery $551_A$ and the Symmetry-Axis of the Beam $053_A$ to coincide with the Symmetry-Axis $553_A$ of the Solar Artery. The Focusing Point ($504'_B$) of the Beam $053_A$ is actually not a point but a Circle $\Pi_2$ with a Diameter $(\Delta_2)$, where $(\Delta_2)<(\Delta)$=Diameter of the Solar Artery, that will be named Entry-Circle $560_A$. In the illustrated embodiment, the diameter of the Entry-Circle $560_A$ of the Beam $053_A$ should appear from any point of the Internal Walls $555_A$ of the Solar Artery $551_A$ under an angle smaller than $2\psi*5°$ (where the factor $\psi>1$ becomes greater as long as the opening-angle of the Beam becomes smaller e.g. for an opening-angle of the Beam equal to ±5° and index of refraction n=1.5 the Diameter of the Entry-Circle can become equal with the Internal Diameter of the Solar Artery). The above condition is necessary in order for any Beam of Rays $053_A$ to be incident onto the internal surface of any Curved Rectangular Prism $556_A$ with an angle smaller than $\psi*5°$ for an index of refraction n=1.5 so that we have total reflection of the Solar Beam $053_A$ from any Curved Rectangular Prism $556_A$ found in their way.

In order to be possible to implement the requirement of incidence under angle±$\psi'*5°$ (where $\psi'*5°$=the projection of $\psi*5°$ in a level vertical to the Axis $553_A$) relative to the radius of the $\Delta_1$ at any point of the internal periphery $\Delta_1$ of the $555_A$, the incoming Beam of Rays $053_A$ must have an Entry-Circle with Diameter $\Delta_2<\Delta$ and an opening-angle $\phi$ smaller or equal to ±$\psi*5°$ relative to its axis of transmission, where $0<\psi=45/9$.

The correction which is imposed by the structure of the Curved Rectangular Prisms causes a behavior in the total reflection of rays in such a way that the projection on a level II vertical to the Axis $553_A$ of a ray that impinge under an angle $\phi<\psi*5°$ on the internal walls of the Solar Artery $551_A$, to emerge parallel to the projection on the II of the ray incoming, so as to continue with sequential reflections (where the projection on the II of each emerging ray is parallel with the corresponding projection on the II of the incoming ray) to impinge always on the next points of incidence on the Internal Walls $555_A$ with an angle that ensures the total reflection from the Curved Rectangular Prisms $556_A$.

The Rays $A_0K_{10}$ of the Beam $053_A$ which impinge with a lateral angle $\phi$ onto the Internal Walls (where on the projection as above e.g. $\phi<5°$ for n=1.5), due to the lateral peculiarity of the total reflection, will emerge from their total reflection in the Curved Rectangular Prisms $556_A$ towards the same side from where they entered and parallel (in the vertical projection of their routing) to the incident Ray $A_0K_{10}$. In this way even the Rays, which impinge laterally on the Internal Walls (but always with an angle $\phi$, e.g., $-5°<\phi<5°$ for n=1.5) will suffer successive total reflections, where the angle of incidence on the Internal Walls will be within the limits for the achievement of total reflection, since each time it emerges parallel (related to the vertical projection of its routing) with the incident ray, which thus maintains its relative location for total reflection always passing from the interior of the Circle $\Pi_2=(560_A)$ (something that ensures always that in the next point of contact with the Internal Wall $555_A$ of the Solar Artery $551_A$ will also have ensured Total Reflection).

On the contrary, without the corrective routing imposed by the Curved Rectangular Prisms $556_A$ the Emerging Ray $K_{20}\Delta_0$ from the total reflection would divert from the parallel routing to the incident Ray $AK_{10}'$ (for the example of the Ray $A_0K_1'$ with vertical incidence of its projection in the level II at the Point $K_1'$ of the Internal Wall $555_A$ of the Solar Artery) in each total reflection by an angle $\phi_1$ (for n=1.5), where $\phi_1$ is the curvature-angle at the incidence point as is defined above (the same relation will also be valid for lateral incidence as above). After a number of total reflections, and due to the algebraic summing of the error of divergences as above, the reflected ray would come out of the limits of the borderline of the Entry Circle $\Pi_1=561_A$, in which limits we have total reflection, therefore this ray in the next incidence would not undergo total reflection on the Internal Walls of the Solar Artery and would come out (loss). Consequently, in the case of the Solar Artery the Curved Rectangular Prisms $556_A$ must impose a correction to the routing of the Emerging Ray $K_2'\Delta$ (with left-handed rotation of $K_2'\Delta$) by an angle $\phi_1$ Owl instead of $3\times\phi_1$ as in the parabolic reflectors above) in order for the projection of $K_{20}'\Delta_0$ described above to emerge parallel to the projection of incident Ray $A_0K_{10}'$ (and the $K_2'$ A parallel to the $AK_1'$).

Therefore, the $K_2K_2'$ should be rotated in left-handed orientation by $\phi_1/n$ (in the example with $\phi_1=1°$ by $1°/1.5=0.6767°$), therefore the sides $H_1\Theta$ and $\Theta H_2$ of the conventional Rectangular Prism should be turned around the points $K_1$ and $K_2$ by ($\phi_1/4n$ each one, the $H_1\Theta$ right-handed and the $\Theta H_2$ left-handed respectively (in the example with $\phi_1=1°$ by $1°/4\times1.5=0.1667$). Thus, the sides of the Curved Rectangular Prisms $556_A$ will have at each point $K_1$ a curvature equal to $\phi_1/4n$ where $\phi_1$ the corresponding angle in each Point $K_1'$ and n the index of refraction of the material of the Solar Artery (again it has been considered that sin $\phi_3$/sin $\phi_4=\phi_3/\phi_4$=n=1.5 due to the very small angles). Actually, the correction imposed even by the Curved Rectangular Prisms $556_A$ for Rays that incident under a lateral angle is not 100% (that is the emerging ray is not completely parallel with the incidence ray), because differences in the required curvature depending on the removal of the total reflection points $K_1$, $K_2$ from the central locations that correspond to the reflection of the vertical to the $555_A$ incident ray. However, the correction that is imposed with the statistical mutual attenuation of the divergences up or down to the initial incidence-angle (dependant on if the second total reflection falls to the right or to the left from the ideal $K_1$ or $K_2$) gives the possibility to the Solar Arteries $551_A$ to present losses of at least one order of magnitude smaller than the conventional Solar Pipes (Solar Tubes), which use reflective walls of total reflection, but with Rectangular (and no curved corrective) prisms of total reflection. Accordingly, for the same percentage of losses, e.g., 50% the Solar Arteries $551_A$ will be able to transport the Solar Light at least one order of magnitude longer in a building for solar lighting, etc. (e.g., if a conventional Solar Pipe for 50% losses transports the Solar Light 50 meters, a Solar Artery with Curved Rectangular Prisms will transport it 500 meters or even more for the same level of losses).

As an alternative, in the Corrected Solar Artery $551'_A$, which is also constructed as the above-mentioned Corrected Solar Artery ($551_A$) (and it bears structural elements with the same numbers but highlighted with tones) but it is characterized by the fact that the corrective route, which is imposed by the Curved Rectangular Prisms ($556_A$) to the Emerging Ray $K_2\Delta_0$ from the total reflection can impose a divergence from the Incident Ray $A_0K_{10}'$ (for the example of the vector component Ray $AK_1'$ with vertical incidence on the level H at the point $K_1'$ of the Internal Wall $555_A$ of the Solar Artery) in each total reflection by an angle $\phi_1/4n \leq \phi_2 < 3\phi_1$, e.g., for angle $\phi_4 = 3\phi_1$ (with n=1.5 as in the case of the parabolic and paraboloidal reflectors in Section 1 above and as it is shown in the Drawing 1b Detail A), where $\phi_1$ is the curvature-angle at the incidence point as it is defined above (the same relation will also be valid for lateral incidence as above) whereupon the $K_2'\Delta$ does not emerge parallel to the $AK_1'$ but converges to the Focus E as in the case of the parabolic and paraboloidal reflectors in Section 1 above. In this case, irrespective of the Solar Artery $551'_A$, the Curved Rectangular Prisms $556_A$ must impose a correction on the routing of the Emerging Ray $K_2'\Delta$ (with left-handed rotation of $K_2'\Delta$) by an angle $\phi_4=3\phi_1$ (as in parabolic reflectors above). Therefore, the $K_2K_2'$ should be turned left-handed by $2\phi_1$ (in the example with $\phi_1=1°$ by 2°) and thus the sides $H_1\Theta$ and $\Theta H_2$ of the conventional Rectangular Prisms should be turned around the points $K_1$ and $K_2$ by $\phi_1/2$ each one, the $H_1 e$ right-handed and the $\Theta H_2$ left-handed respectively (in the example with $\phi_1=1°$ by 0.5°). That is, the sides of the Curved Rectangular Prisms $556_A$ will have at each point $K_1$ a curvature equal to $\phi_1/2$ where $\phi_1$ the corresponding angle in each Point $K_1'$ and n the index of refraction of the material of the Solar Artery (again it has been considered that $\sin \phi_3 / \sin \phi_4 = n = 1.5$ due to the very small angles).

The optical systems for the transportation of the visible part of the solar spectrum, which use conventional optical fibers (even high-quality fibers) for distances of the order of the 20-30 meters suffer from optical losses in the order of 50%, because it does not exist suitable material for all the wavelength range of the visible solar radiation spectrum (each material of optical fiber is tuned at a special wavelength, outside from which the optical losses increase vertically). On the contrary, all Narrow Beam of Rays $053_A$ that enter the Walls $554_A$ of the Artery $551_A$ internally undergo total reflection by the external Curved Rectangular Prisms ($556_A$) and emerge again from the internal side according to the laws of total internal reflection, as it is described below, and travel along the interior of the Artery ($551_A$) inside the air with minimal losses compared to the conventional optical fibers constructed from the same quality transparent material (e.g. fused silica, super clear plastic optical fibers etc). Each reflected ray in the Solar Artery $551_A$ after each total reflection travels in the interior $551_A$ at least 10-100 times bigger length in the air than in the transparent optical material (dependant on the thickness of the Walls $554_A$ and the Diameter $555_A$ of the Artery $551_A$), decreasing thus its absorption losses by an equivalent factor.

Consequently, for same distances of transportation of the visible solar spectrum and the same construction material, the use of Solar Arteries $551_A$ will decrease the optical losses in a small percentage 5-10% or even smaller of the above reported losses of optical fibers, allowing thus the transport of the visible part of the solar spectrum 10 or 20 (or even more) times longer for the same level of losses.

The Solar Arteries $551_A$ in combination with the Corner Elements $571_A$ and Elements of Concentration or Distribution $581_A$, as described below, that allow the creation of a Collection-Network $590_A$ and a Distribution-Network ($590_B$) towards the corresponding Solar Lighting Fixtures $591_A$ inside a building (the Lighting Fixtures $591_A$ also can be provided with conventional lamps with dimmers for the compensation of the daily reduction of solar light, during the nights etc.).

The Solar Arteries $551_A$ are implemented preferably in straight parts for biggest exploitation of the Opening-Angle $\phi$ of the Entering Beam $053_A$ (they can also accept changes of the angle of their routing-axis up to the limits that are allowed by the each-time achievement of total reflection). The requirements of a big change of direction along the routing (e.g. 90°) are implemented by the Corner Element $571_A$, which is constituted by the incoming and outgoing Solar Arteries $551_A$ (fixed and rotated around their axis) and by one conventional Reflector $574_A$ with high reflectivity for the Wide Beam $052_A$ with an angle, e.g., $-45°<\phi<45°$ or for the Narrow Beam $053_A$ with an angle e.g. $-5°<\phi<+5°$ a Total Reflection Reflector $575_A$ with parallel Rectangular Prisms $576_A$, whose Top-Acmes $577_A$ are parallel to the level that define the axes $578_A$ and $579_A$ of the Entry Parts $572_A$ and Exit Parts $573_A$.

The Reflector $574_A$ or the TRR $575_A$ is placed under an angle of 45° to the axis $553_A$ of the Solar Artery in order to change the direction of the transmitted Solar Beam $053_A$ by 90°, but can change the placement-angle, e.g., to 50° for the achievement of a change of the direction of the Beam $053_A$ by a double-angle, in this case by 100°.

The Corner Element $571_A$ can be also implemented with a Prism $571'_A$ of right-angle divergence made of a diffractive clear material or crystal or even water clear glass, which functions at $-90°<\phi<90°$, imports however losses of reflection by the entrance and by the exit of the Beam $053_A$. For the entrance of many Beams $053_A$ from various small Solar Arteries $551_A$ in one bigger Solar Artery, it can be used the Multiple Corner Element $581_A$ that has a Polygonal Reflective Surface $582_A$ constituted from many TRR $575_A$ each under an angle of 45° to the Axis $553_A$ of the opposite Solar Artery $551_A$, and supported suitably on the perforated against the $551_A$ Nutshell $583_A$ by which $575_A$ the Beams $053_A$ from various Solar Arteries $551_A$ with small diameters enter into a bigger Solar Artery $561_A$, or reversely from a bigger Solar Artery $551'_A$ they come out and are distributed into many smaller Solar Arteries arranged circularly under an angle of 90° to the Axis $553'_A$ of the $551'_A$. The Multiple Corner Elements can be also materialized by the frustum-cone-shaped (internally) Prism $581'_A$ from a material as the $571'_A$, which, however, imposes an increase of the angle $\phi$ and losses of reflection of entrance-exit.

Finally, for the subtraction of Solar Radiation from a bigger Solar Artery ($551'_A$) to a smaller one ($551_A$), a Subtraction Corner Element $571'_A$ is used. Subtraction Corner element $571'_A$ is constituted by a circular Conventional Reflector $574'_A$ or TRR $575'_A$ that it is placed under an angle of 45° inside the bigger Solar Artery $551'_A$ and sends the reflected, under a corner of 90°, Solar Beam $053_A$ through the lateral Circular-Opening $562_A$ into the smaller Solar Artery $551_A$ that begins with a diameter equal with the diameter of the Opening $562_A$.

What is claimed is:

1. A system, comprising:
a primary Parabolic Total Reflection Reflector (PTRR) that collects incident sunlight and reflects a wide beam of rays, the primary PTRR comprising at least one Corrected Rectangular Prism (CRP) that enables correct focusing;
a secondary Ellipsoidal Total Reflection Reflector (ETRR) that receives at least a portion of the wide beam of rays and focuses the wide beam of rays into a narrow beam of rays, the secondary ETRR comprising at least one CRP that enables correct focusing;
one or more solar arteries that receive at least a portion of the narrow beam of rays and guide at least the portion of the narrow beam of rays under total reflection, the one or more solar arteries comprising at least one Corrected Rectangular Prism (CRP) that minimizes radiation propagation losses;
one or more elements accessory to the one or more solar arteries, the one or more elements guide sunlight in at least the portion of the narrow beam of rays that is received by the one or more solar arteries, wherein the one or more elements comprise at least one CRP that minimizes sunlight propagation losses; and
reflectors formed from CRPs, which define a solar radiation beam path for reflecting or propagating solar radiation to an intended destination and defined by a curvature of the system having a focal center of curvature (E) for focusing the solar radiation beam, wherein the reflectors comprise (i) a front surface, which is oriented towards the solar radiation beam path and is smoothly curved in correspondence with the curvature of the solar system, and (ii) a rear surface comprising essentially rectangular prisms with tops of the essentially rectangular prisms enveloped by a curvature parallel to that of the front surface, further wherein
in cross-section of an essentially rectangular prism in a plane at least locally perpendicular to the longitudinal tangent of the essentially rectangular prism's top acme:
separate sides of the essentially rectangular prisms are curved for a corrected accurate focusing, and
in the section of the front surface, for each essentially rectangular prism, a mid point is defined as a perpendicular projection of a top acme point of the essentially rectangular prism onto the section of the front surface, and an intersection point is defined as a perpendicular projection of a selected point on a curved side of the essentially rectangular prism onto the front surface intersection curve, and wherein a tangent in each point along the curved sides has an orientation angle relative to the orientation of the sides at the top acme point corresponding with and dependent on a predetermined angle formed between intersecting tangents at an intersection point and the mid point.

2. The system of claim 1, wherein the primary PTRR comprises one or more Tiles of Total Reflection (TTR) based on an appropriate parabolic substrate, wherein at least one tile that is part of the one or more TTR comprises:
a first surface of smooth parabolic form; and
a second surface of parabolic form and bas-relief that comprises the at least one CRP, wherein a top acme of the at least one CRP converges to a top of the primary PTRR and at least one cross-section of at least one side of the at least one CRP is at least one curved line that enables correct accurate focusing.

3. The system of claim 2, wherein the at least one tile that is part of the one or more TTR has a first dimension of substantially 20 cm and a second dimension of substantially 20 cm, the material of the at least one tile is one of transparent glass without iron oxide or transparent plastic.

4. The system of claim 2, wherein the primary PTRR is based on at least one of a metal support frame affixed on a first mechanism of rotation about the first rotation axis, the first mechanism is based on a second mechanism of rotation about the second axis, wherein the first mechanism of rotation and the second mechanism of rotation are attached to a support base via at least in part two or more bearings.

5. The system of claim 4, wherein the secondary ETRR comprises one or more TTR and is based on a metal support frame that is attached to the support base, a material of the secondary ETRR is the same as a material of the primary PTRR, wherein one or more tiles in the one or more TTR in the secondary ETRR comprise:
a first surface of one of a smooth parabolic form or an ellipsoidal form, wherein the form of the first surface is dictated at least in part by the position of a focal point of the secondary ETRR relative to the position of a focal point of the primary PTRR; and
a second surface of one of parabolic form or ellipsoidal and bas-relied form, wherein the second surface comprises the at least one CRP, wherein a top acme of the at least one CRP converges to a top of the secondary ETRR and at least one cross-section of at least one side of the at least one CRP is at least one curved line that enables focusing.

6. The system of claim 5, wherein, to reflect the wide beam of rays as a narrow beam of rays, the secondary ETRR is located in a position behind a focal point of the primary PTRR, wherein the position determines a degree of concentration and a dispersion angle of the narrow beam of rays.

7. The system of claim 1, wherein the orientation angle ($\phi 2$) and the predetermined angle ($\phi 1$) obey the following relationship: ($\phi \frac{1}{4} n$) $\leq \phi 2 \leq \phi \frac{1}{2}$), where n is an index of refraction of the material of the essentially rectangular prism in the relationship.

8. The system of claim 1, further comprising one or more reflection media located in front of a focal point of the secondary ETRR at a predetermined angle with respect to the narrow beam of rays, wherein at least one reflecting medium in the one or more reflecting media reflects the narrow beam of rays into at least one solar artery in the one or more solar arteries.

9. The system of claim 8, wherein at least one reflecting medium in the one or more reflection media is removed to allow the narrow beam of rays to focus on a spectrally selective black absorbent surface, which is located nearly at the focal point of the secondary ETRR and transfers heat from the narrow beam of rays focused on the spectrally selective black absorbent surface to a fluid, wherein the fluid is utilized as a heating source or to produce cooling energy for air-conditioning through an adsorption heat pump.

10. The system of claim 9, wherein the at least one reflecting medium is a cold reflector that reflects nearly all light substantially within the visible part of an electromagnetic (EM) radiation spectrum and transmits nearly all light within at least a portion of the infrared (IR) part of the EM radiation spectrum, the light within at least a portion of the IR part of the EM radiation spectrum is focused directly onto the spectrally selective black absorbent surface, wherein the cold reflector is oriented at a predetermined angle towards the path of the narrow beam of rays to divert the narrow beam of rays by about 90 degrees towards the at least one solar artery that of the one or more solar arteries, for a diversion angle of about 90 degrees, the predetermined angle is substantially 45 degrees.

11. The system of 10, further comprising an auxiliary focusing reflector that focuses the narrow beam of rays onto photovoltaic cells to produce at least one of electrical energy or thermal energy.

12. The system of 11, wherein the photovoltaic cells are deposited at the position of, and in replacement of, the spectrally selective black absorbent surface and behind the cold reflector or in absence thereof.

13. The system of claim 1, wherein at least one element of the one or more elements accessory to the one or more solar arteries connects the one or more solar arteries to a main solar artery that guides at least part of the at least a portion of the narrow beam of rays to one or more disparate elements accessory to the one or more solar arteries for sunlight illumination within a building via one or more disparate solar arteries.

* * * * *